United States Patent [19]

Aucouturier et al.

[11] Patent Number: 4,682,114
[45] Date of Patent: Jul. 21, 1987

[54] POWER MODULATOR PROVIDED WITH A TRANSFORMER

[75] Inventors: Jeanne Aucouturier, L'Hay-Les-Roses; Hubert Leboutet, St. Cloud; Jean-Louis Pourre, Chatillon-Sous-Bagneux, all of France

[73] Assignee: CGR/MEV, Buc, France

[21] Appl. No.: 599,818

[22] Filed: Apr. 13, 1984

[30] Foreign Application Priority Data

Apr. 15, 1983 [FR] France ................. 83 06223

[51] Int. Cl.⁴ .............. H03K 3/86; H03K 3/00; H03L 5/00; H01F 27/28
[52] U.S. Cl. ................... 328/67; 307/268; 307/264; 307/106; 336/182
[58] Field of Search .......... 307/246, 252, 269, 268, 307/265, 263, 262, 570, 571, 106, 108; 328/58, 67; 332/9R, 12

[56] References Cited

U.S. PATENT DOCUMENTS

| | | | |
|---|---|---|---|
| 1,616,200 | 2/1927 | Shackelton | 336/182 |
| 3,119,968 | 1/1964 | Schonberg | 307/265 |
| 3,590,279 | 6/1971 | Perusse | 307/265 |
| 3,772,601 | 11/1973 | Smith | 307/106 |
| 3,968,400 | 6/1976 | Weinreich | 328/67 |
| 4,255,668 | 3/1981 | Harrison | 328/65 |
| 4,479,175 | 10/1984 | Gille et al. | 363/41 |

FOREIGN PATENT DOCUMENTS 1402435  7/1964  France .

OTHER PUBLICATIONS

W. C. Sealey, Transformers Theory and Construction, 1948, pp. I-29 to I-31.

Primary Examiner—Stanley D. Miller
Assistant Examiner—Trong Quang Phan
Attorney, Agent, or Firm—Oblon, Fisher, Spivak, McClelland, & Maier

[57] ABSTRACT

The invention concerns a power modulator provided with a transformer. This transformer having a high transformation ratio receives a low voltage impulse and transforms it into a high voltage impulse directly applicable on a high frequency or hyperfrequency tube in order to create a powerful impulse magnetic field. The transformer is particularized by the realization of its primary composed of a plurality of primary windings, all of which are connected in parallel and which, put end to end, extend along the entire lengths of the secondary. They are wound furthermore around the secondary and not inside it.

11 Claims, 8 Drawing Figures

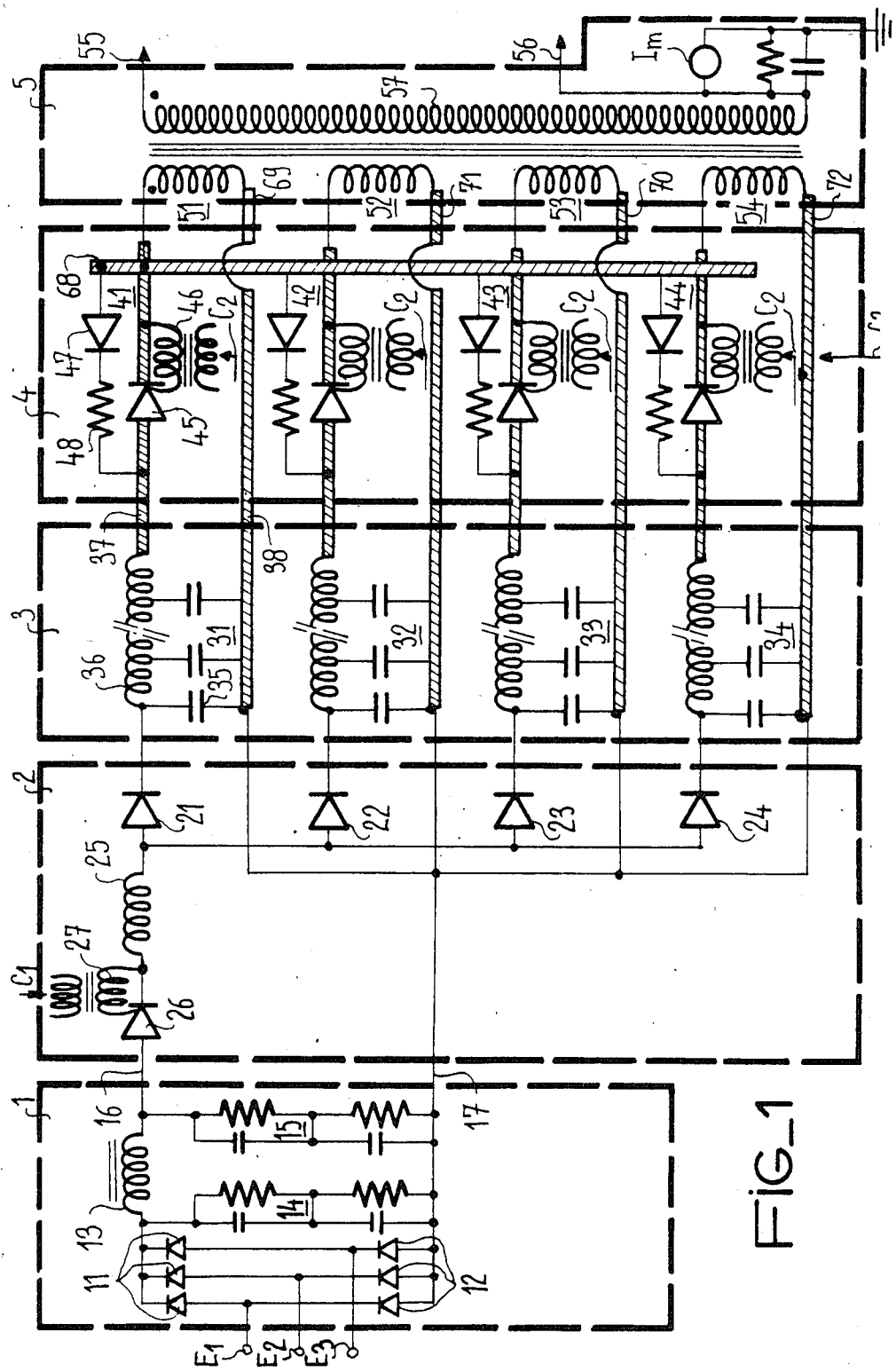
FIG_1

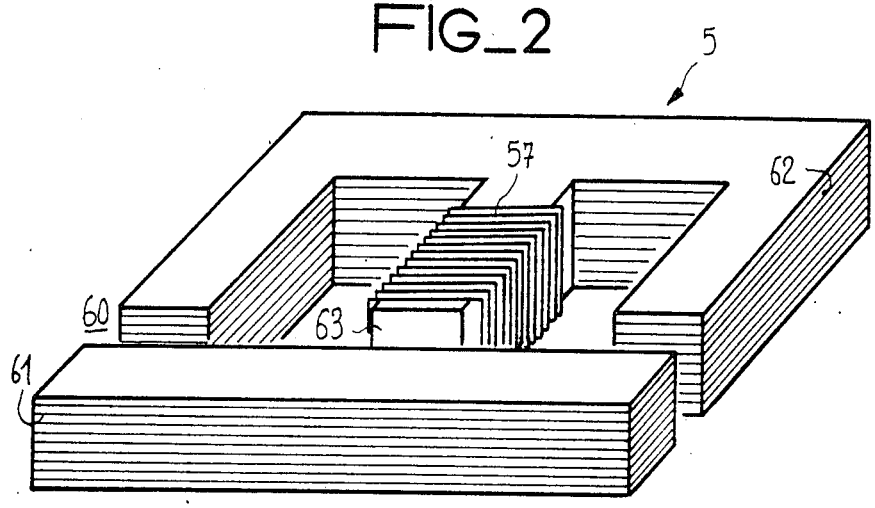
FIG_2
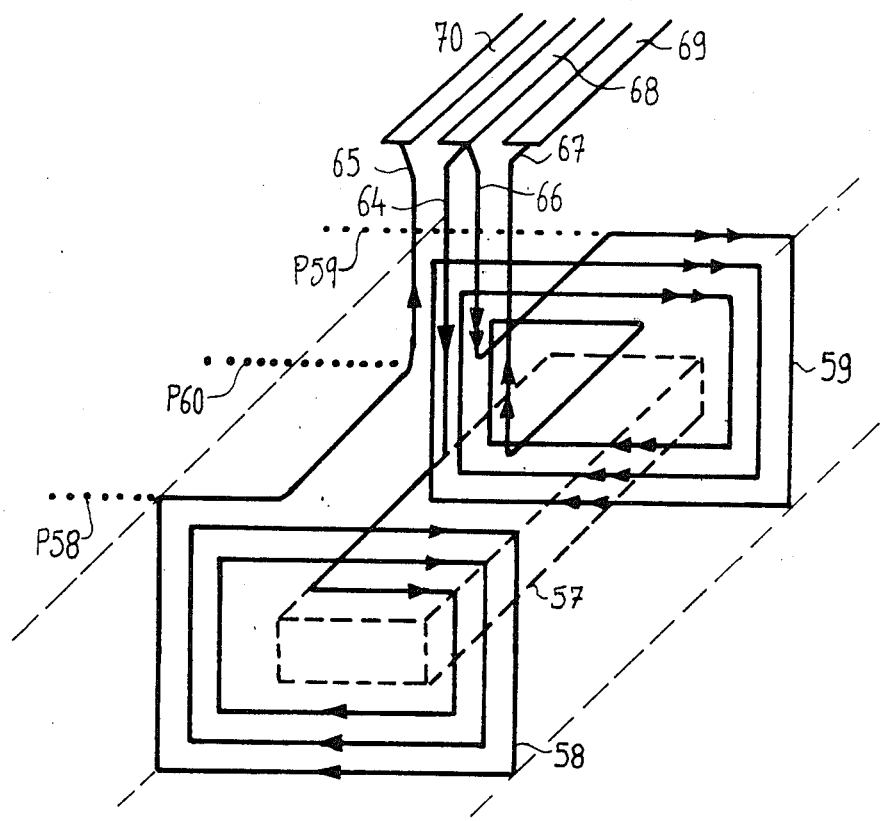
FIG_3-A

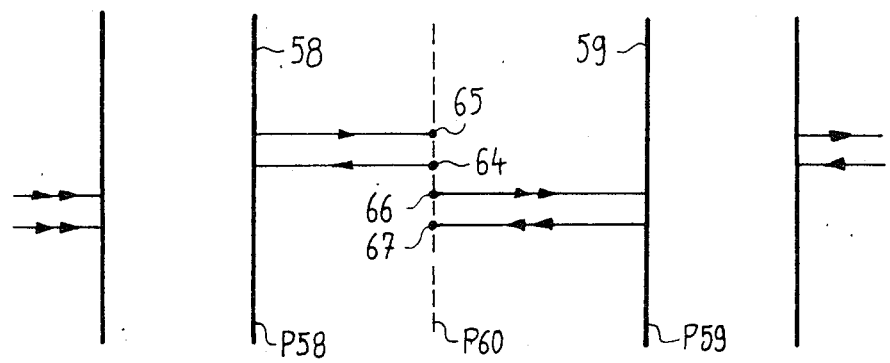
FIG_3-B
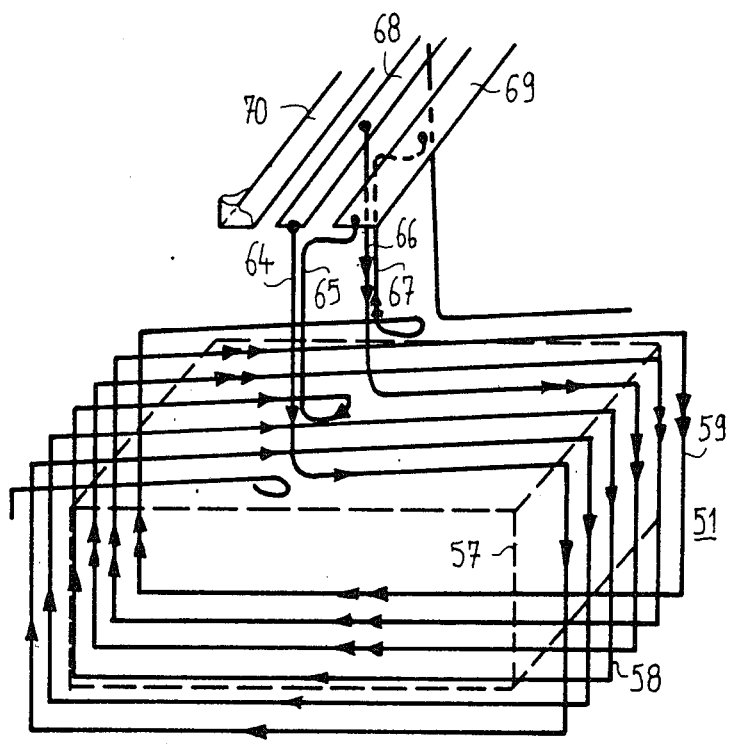
FIG_3-C

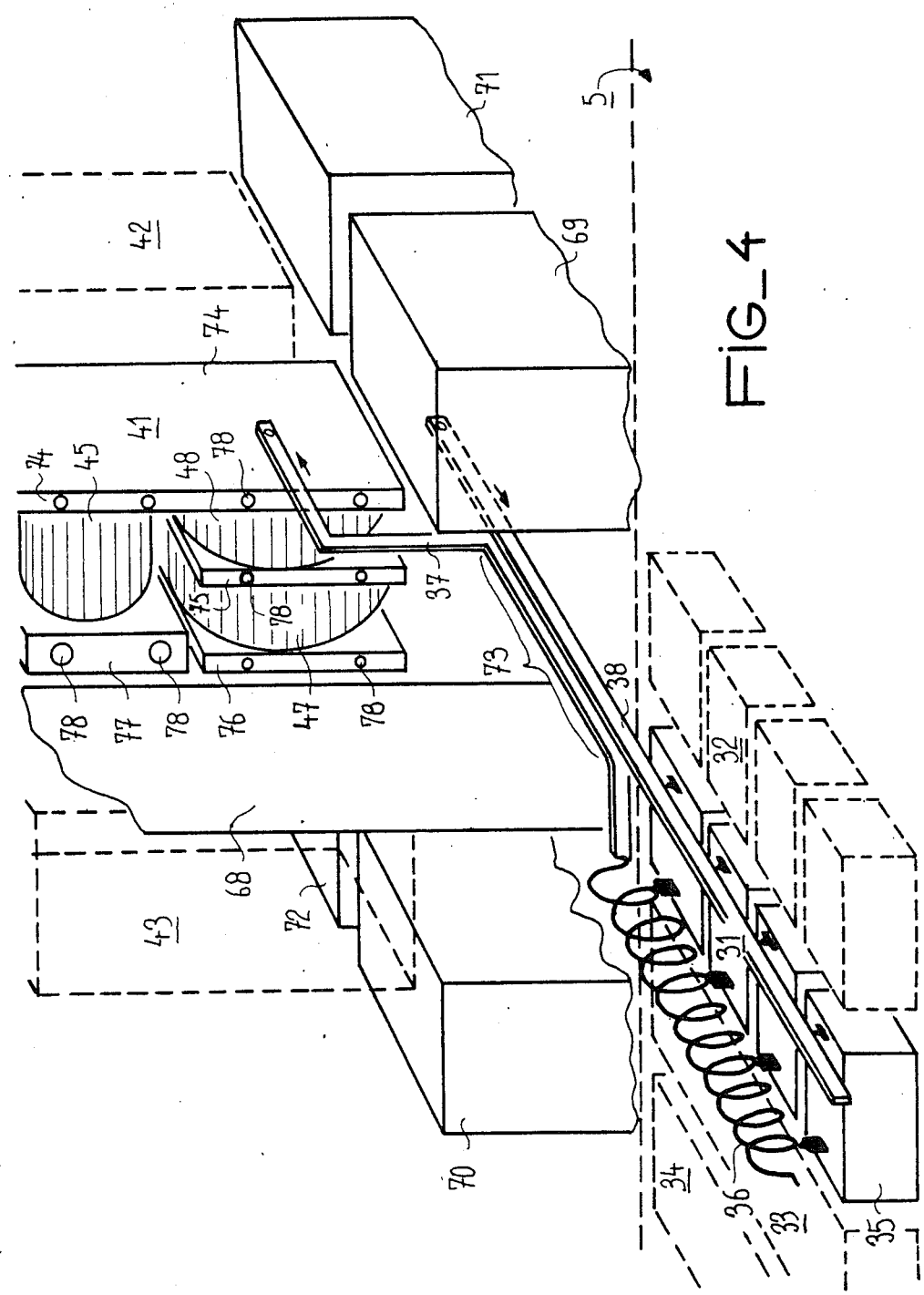

FIG_5
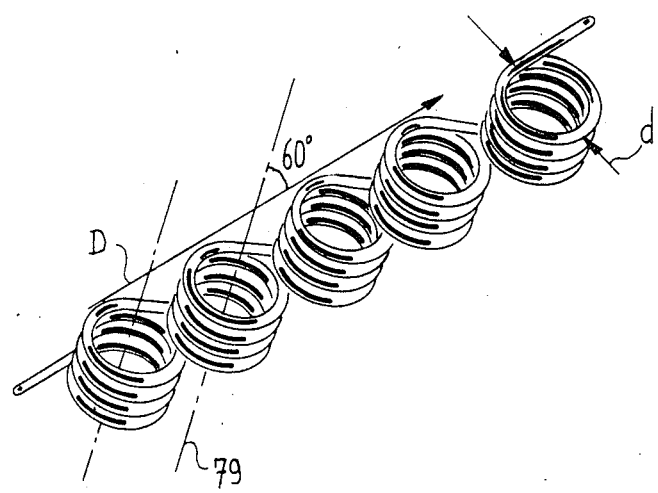
FIG_6
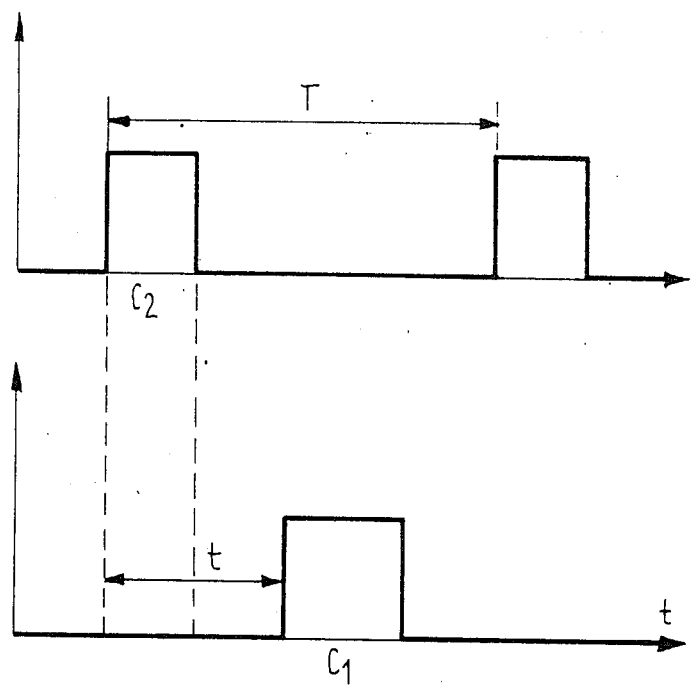

POWER MODULATOR PROVIDED WITH A TRANSFORMER

BACKGROUND OF THE INVENTION

1. Field of the Invention

The present invention relates to a power modulator provided with a transformer used in particular to supply electromagnetic energy to resonant cavities of a linear accelerator.

In a linear accelerator, electrons emitted by a gun pass through a series of electromagnetic cavities. During their passage in these cavities, they are accelerated by the electromagnetic field that exists therein. At the output of this series of cavities these electrons hit a target at great speed which in turn emits other particles. These latter particles are thus used in industrial irradiation applications or in radiotherapy applications according to known methods. The main characteristic of these latter particles is their energy bound to the energy of the incident electrons.

To confer great energy on the incident electrons, it is necessary that the electromagnetic field prevailing in the cavities be dense. For both techological and utilization reasons, the operating of a linear accelerator is of the impulse type. This means that the electromagnetic field is established in the cavities for short durations, for example, from several nanoseconds to several hundred microseconds and with a certain periodicity, for example, from 25 to 1000 Hertz.

The establishment of the electromagnetic field in the cavities is obtained through inductive or capacitive coupling of these cavities to an electronic tube. For operating frequencies lower than several hundred Megahertz, the electronic tube utilized is generally a triode. By operation, upon the appearance of a very high direct current voltage between the cathode and the anode of this tube, is emitted an electromagnetic field between its electrodes. The oscillation frequency of this field is imposed by the forms and dimensions of the cavities.

2. Description of the Prior Art

In the prior art techniques the very high voltage applied between the cathode and the anode of the triode tube, currently in the range of several score kilovolts, is obtained by raising, by an impulse transformer having a transformation ratio (equal to $N_2/N_1$) lower than 20, the voltage of impulsions produced by a high voltage stage. The high voltage stage must therefore supply impulses with an amplitude higher than several thousand volts. The realization of this high voltage stage is expensive.

SUMMARY OF THE INVENTION

In the present invention, the power modulator, fulfilling the functions ensured by the high voltage stage and the impulse transformer, overcomes these problems by replacing the whole assembly by a single impulse transformer having a high transformation ratio. However, this solution comes up against operating difficulties which have until now always been an obstacle to its adoption. Indeed, the realization of a transformer having a high transformation ratio encounters essentially one problem: that of reducing the counter-electromotive forces produced by the presence of leakage inductances. In fact, if the transformation ratio is high, the counter-electromotiveforces, proportional to L (dI)/(dt), are that much higher as (dI)/(dt) is higher. This is exactly what happens when the transformation ratio is high since in this case the primary current is very high.

The invention concerns a power modulator provided with a transformer to receive electric impulses produced by an impulse generator stage and to produce higher voltage electric impulses, wherein the said transformer is of the armoured type and in that it comprises a certain number of primary windings connected in parallel to the impulse generator stage, these primary windings being wound about the secondary winding of this transformer.

BRIEF SUMMARY OF THE DRAWINGS

The invention will be better understood through reading the following description, with reference to the annexed figures, given by way of non-limitative illustration. The same references designate the same elements on the figures, which represent:

FIG. 1 the synoptic schema of the modulator according to the invention;

FIG. 2 a view in persepective of the magnetic circuit of the transformer according to the invention;

FIGS. 3a to 3c, the particularities of primary winding and connections of this transformer;

FIG. 4 a view in perspective of the different parts of the modulator according to the invention;

FIG. 5 a view in perspective of a part of the delay lines used to supply the transformer;

FIG. 6 a time diagram of the control signals of the modulator.

DESCRIPTION OF THE INVENTION

FIG. 1 represents the synoptic schema of the modulator according to the invention. A rectifier circuit 1 supplied with low alternating current voltage by the sector is connected to a charge circuit 2 of an assembly 3 of the delay lines. This assembly 3 is connected to an impulse switch stage 4 itself connected to the transformer 5 of the invention. In the example represented, stage 4 comprises four impulse switches, numbered 41 to 44, each supplied by a delay line, respectively numbered 31 to 34, and each respectively connected to one of the primary circuits of the transformer 5 referenced 51 to 54. The circuit 2, the assembly 3 and the stage 4 constitute an impulse generator stage.

The rectifier circuit 1 known in the prior art techniques, comprises an assembly of thyristors 11 and thyristors 12 to rectify the triphased alternate voltage introduced on its inputs E1, E2, E3. It comprises, furthermore, a filtering circuit in $\pi$ where an inductance 13 is mounted in cascade between two capacity-resistance quadripoles 14 and 15. In one example, the triphased sector is a 380 volts sector, and the output of the rectifier circuit 1 supplies a low direct current voltage of about 500 volts between its terminals 16 and 17.

The circuit of charge 2 of the delay lines comprises essentially an assembly of diodes numbered 21 to 24 the anodes of which are all connected together to an inductance 25. The object of this mounting, of a known type, is to charge the delay lines of the assembly 3 with twice the voltage that is supplied by the rectifier circuit 1. The reasons for this doubling will be set out in the explanation of the operating of the delay lines of the assembly 3. Furthermore, the supply circuit 2 comprises a thyristor 26 connected to another terminal of the inductance 25. The object of the thyristor is to authorize only the charging of delay lines 3 once the impulse switches of the stage 4 have been deactivated. This thyristor 26 is thus controlled by an impulse control C1 applied to the control 27. The synchronization of the control C1 with the activation control C2 of the impulse switch stage 4 will be seen herein-below.

The impulse switches of the stage 4 are supplied by delay lines of the assembly 3. It can be expressed schematically that these delay lines constitute a ballast being charged slowly in the periods where there are no impulses and being suddenly discharged at the moment of production of these impulses. The delay lines thus comprise an assembly of quadripolar half-cells, capacitor 35 and inductance 36, put into cascade. During the charge, the capacities 35 of these half-cells are twice the voltage supplied by the circuit 1. They are indeed mounted in parallel between the cathodes of the diodes of the circuit 2 and the terminal 17 of the rectifier circuit 1. During the discharge, the electric energy stored in the half-cells of the delay lines is discharged in charges carried by the primary windings of the transformer 5. The characteristic impedance of each of the delay lines of the assembly 3 is calculated equal to the impedance presented by each of these primary windings. The delay lines of the assembly 3 thus behave like voltage generators, supplying an adapted charge, and for which it is known that the maximum energy transferred occurs at half the voltage of the generator. The reason for existence of the diodes and the inductance will be found therein. Thus, in the example where the rectifier circuit 1 supplies a direct current voltage of 500 volts, impulses of 500 volts amplitude are found at the terminals of the primary windings of the transformer 5.

The number of half-cells formed by the capacitors 35 and the inductance 36 in each of the delay lines is bound to the form of the impulse that it is required to feed the primaries of the transformer 5. In one example, the number of these half-cells is equal to 14. If the equivalent inductances and capacitors of the delay line are called L and C, the duration $\tau$ of the discharge impulse of these lines is expressed by the formula $\tau = 2\sqrt{L.C.}$ while the characteristic impedance of this line is expressed by the formula $Zc = \sqrt{l/c}$ where l and c represent respectively the values of the inductances 36 and the capacitors 35. These different terms allow to calculate the parameters of the delay line for the required utilization.

In the impulse switch stage 4, elementary impulse switch 41 is connected to the output conductors 37 and 38 of the corresponding delay line 31. This impulse switch 41 comprises essentially a gate constituted by a thyristor 45 provided with its associated control. This associated control, simulated in the form of a transformer 46 placed between the drain and grid, is fed a control impulse C2. This gate operates in the following way: upon the appearance of the control C2, the thyristor 45 becomes passing and the available voltage on the conductors 37 and 38 of the delay line 31 is applied suddenly to the terminals 69 and 68 of the primary winding 51. The purpose of the reverse diode 47 is to facilitate the deionization of the thyristor 45 after the occurrance of the impulse. In case of an incident, such as accident or failure, at the level of the charge of the transformer 5, its purpose is also to prevent the delay line 31, which is put into self-oscillation about itself, from blowing. There are risks in this happening in particular when the triode tube, connected to the output of the transformer 5, is short-circuited. In this case, the impedance of this short-circuit, carried to primary 51, has the effect of presenting a short-circuit between the conductors 37 and 38 of the delay line 31 which leads it to oscillate. The opposite diode 47 thus has the purpose of shunting the negative alternances being produced during this oscillation and at the same time of preventing such an oscillation. A circuit for measuring the average impulse current "Im" allows, furthermore, to cut the modulator in the case of exceeding a security threshold.

In the example set out, the transformer 5 comprises four primary windings 51 to 54. These primary windings in a preferred manner are each replaced, by a group of primary windings in parallel comprising themselves a certain number of turns. In one example, a primary winding is constituted by three turns, a group of primary windings contains ten windings, and the transformer contains four groups. In this same example, the secondary 57 available between the terminals 55 and 56 comprises 240 turns. In the application thus proposed, the transformation ratio is thus equal to 80 since it is the result of the division of the number of turns of the secondary winding 240 by the number of turns of one of any primary windings 3. This transformation ratio is thus clearly higher than 40, this latter value being a limit normally acknowledged for elevator impulse transformers.

Various embodiments could have been selected so as to achieve the same result. It is possible, in particular, to conceive a supply circuit of the transformer 5 with a single delay line and a single impulse switch, respectively 31 and 41, and to connect all the primary windings in parallel on this impulse switch 41. The interest of the solution of the present invention lies in the fact that the total current circulating in the primary of the transformer 5 is the sum of the current circulating in each of the primary windings. As these primary windings are numerous, the primary current in each of them is thus divided. The fact of maintaining four groups of primary windings also has the effect of dividing by four the maximum current of passage through the thyristors 45. Furthermore, the counter-electromotive force due to the leakage inductances will be reduced in the same proportion. This advantage is furthermore, improved by a particular disposition of the primary windings on the transformer 5 that will now be analyzed with reference to FIGS. 2 and 3.

FIG. 2 represents the magnetic circuit 60 of the transformer 5. The magnetic circuit according to a known arrangements of in the art is constituted by a stack of metal sheets 61 and 62 stamped out in the form of I for the first and in the form of E for the second. THe closing of the magnetic circuit 60 is obtained by applying the pile of metal sheets 61 onto the ends of the legs or props of the stack of the metal sheets 62. Another arrangement that could be used consists, as is known, in pressing the stacks of metal sheets in the form of T against the stacks of metal sheets in the form of C. Any other realization suitable for the realization of a magnetic circuit in the general form of an "8" could furthermore, from the point of view of the invention give equivalent results.

The transformer 5 is known as an armoured transformer due to the fact that the secondary winding is wound on the central leg 63 of this transformer. It should be noted that one particularity of the transformer 5 of the invention is that the secondary winding 57 is wound directly on the central leg 63 of the transformer 5 while, for reasons of insulation, it is normally the primary winding that is wound, in the prior art techniques, closest to the magnetic circuit and thus the central leg 63. The electrical insulation of the secondary winding and of the magnetic circuit is obtained by placing an insulating layer between the winding and the leg 63. This insulating layer in one example is made of vinyl polychloride and different elements soaked in oil.

In one realization example, the secondary winding is realized in three superimposed and electrically insulated sheaths. The spreading out of turns in the first sheath the nearest to leg 63, is carried out in what is called "go" direction; that of the second sheath is carried out in the opposite direction called "return" direction and the third is carried out in the same direction as the first. The winding is continuous from one end of the secondary winding to the other and is such that the magnetic contributions of these three sheaths are all oriented in the same direction.

On FIG. 3A, the particularities of winding of the primary windings of the transformer can be distinguished. In order not to overload the figure, only one part of the primary windings has been represented. It will be noted that these primary windings are wound outside the secondary winding 57. The secondary winding is shown by a parallelepiped in broken lines. The primary windings are wound around the outside of the secondary windings. This figure shows a primary winding 58, through which flows a current in the direction of single arrows and a primary winding 59 through which flows a current in the direction of double arrows. The directions of these currents are compatible in order to produce electromagnetic fields of the same orientation. Each of the primary windings 58 and 59 comprises three turns. The section of these turns of rectangular form, similar to the form of the turns of the secondary winding 57, is bound to the form of the section of the central leg 63 of the transformer 5. Forms other than rectangular can be retained.

One particularity of realization of these windings 58 and 59 is that their conductor connection wires, respectively 64, 65 and 66, 67 are brought closer to one another to contact the distribution pieces 68, 69 and 70. Due to their respective proximity, these conductor wires through which flow equal currents in opposite directions, induce interference electric fields than cancel each other out and similarly reduce the leakage inductances bound to the primary winding involved. Another particularity of the primary windings shown is that each of them only extend on one part the length of the secondary winding 57. It will thus be noted that these primary windings are generally wound in a spiral. Each primary winding is thus realized in a plane: the planes P58 and P59 (these are represented furthermore in a view from above on FIG. 3B). The section determined by each winding thus has a thickness approximately equal to the section of the wire having been used for its realization. Such as thus realized, it is noted that two matched consecutive windings, here windings 58 and 59, are only spread over three consecutive sections represented by planes P58, P59 and P60. FIG. 3B presents a succession of matched windings each occupying three sections. The separation of the three sections is exaggerated as so to better understand the figure. This manner of proceeding has two important consequences. Firstly, the realization of the primary of the transformer becomes compact. Secondly, the interference inductances carried by the conductor connection wires (for example, 64 and 65) are pratically rendered zero. Indeed, along all the distance travelled, on both the part that separates the winding section P58 from the section of connection P60, and on the part that separates the top of the turn from the connectors 70 and 68, the wires 64 and 65 through which flow equal currents in opposite directions are parallel and close to each other.

The assembly of these primary windings 58, 59 etc. ... put mechanically end to end covers on all its length the winding 57. In the example given, where the secondary in three sheaths spreads over 240:3=80 turns, the 40 primary windings are spread over (40:2)×3=60 turns. Taking into account the necessary insulation between the segments of the primary windings, these two spreadings are compatible; the primary covers the secondary along its entire length.

According to the disposition herein described, it will be noted that the fact of having disposed primary winding outside the secondary winding 57 removes these windings from the central leg 63 of the magnetic circuit (not represented). This disadvantage is counterbalanced by a considerable limitation of the leakage inductance and by an easier connection of these easier primary windings on the distribution elements. Indeed, the connectors or connection wires 64 and 65 develop in free space up to these pieces and do not have to cross through the sheath, even the triple sheath, constituted by the secondary winding 57.

The realization of the primary in two sheaths, or even in several sheaths, can be envisaged. It will be clearly seen on FIG. 3C, where the primary windings are conventionally wound, that the available space between the connectors wires 64, 65 and 66, 67 is adapted to allow the realization of another sheath outside the sheath represented. In this variant, the wires of the connection wires are also brought closer together.

FIG. 4 represents the assembly of the modulator according to the invention comprising especially at least one delay line 31 to supply a pulse switch 41. These pulses are applied to the primary windings of the transformer 5 by the distribution elements 68 and 69 that are sunk into the transformer. This representation allows to clarify the relative positions of the delay lines 31, 32, 33 and 34, as well as those of pulse switches 41, 42, 43 the pulse switch 44 not being represented. In this view in perspective, the control leg (which is not visible) of the magnetic circuit of the transformer 5 is disposed under the distribution element 68 in the alignment of the connecting rail 38.

FIG. 4 shows two particulars used for the mounting. First the conductor connecting rails 37 and 38, ensuring the association of the delay line 31 to the pulse switch 41, takes approaching on the largest part 73 of their paths. In practice, these two rails are almost stuck to each other and are only separated by a insulating film. The object of this arrangement is to prevent the creation of an interference induction at the output of the delay line that will return to render it unsuitable. This disposition introduces an interference capacity due to the proximity of the two rails 37 and 38, but the presence of this interference capacity does not present any drawbacks. The concern of reducing the interference inductances of the delay line is bound to the need of reducing their effects which are that much more important as the current that passes through them is high, which is the case here.

The thyristor 45, the diode 47 and the resistance 48, all of a cylindrical type, are connected between the connection rail 37 and the distribution element 68 by a set of conductor plates 74 to 77. These plates are pressed by mechanical means (not represented) against the distribution element 68. The particularity of these conductor plates is that they are hollow and that they are provided with openings 78 allowing the passage of an insulating cooling liquid. Furthermore, it will be noted that, to reduce the leakage inductances, the lengths of the contacts have been reduced to a minimum, thus giving the assembly a compact appearance.

Secondly, this FIG. indicates how the different distribution elements 68 to 72 are disposed. While element 68, called hot element, common to one of the connectors of all the primary windings, is disposed transversally in the center of the transformer 5, the element called cold elements, 69 to 72, are disposed in two alignments on either side of this hot element, respectively the alignments 69, 71 and 70, 72. This disposition is to be brought together in order to better understand the disposition of the elements on FIGS. 3A and 3C. This FIG. also shows the continuous disposition of the windings 36, of which certain parts of turns enter into contact with one of the terminals of the capacitors 36, thus simply reducing the association between these inductances and these capacitors.

FIG. 5 present a particular realization of hte inductances 36 of the delay lines. These inductances 36 are formed of a certain number of turns, in the example four turns put side by side. The winding axes of these groups of turns, all of which are parallel to winding axis 79 of one of them are inclined with respect to alignment D of these inductances 36 by an angle of about 60°. It can be demonstrated that this angle is such that is ensures the best decoupling of inductances 36 between each other. A second particularly of these windings is that the diameter d of the turns increases from the left-hand side of the figure to the right-hand side. The right-hand side is that closer to the transformer 5. Diameter variation is about 10%. In one example, these diameters pass from 8.6 cm to 9 cm. The reason for this increase lies in the necessity of opposing the premagnetization effect of the transformer that would result in delivering, at the output of this transformer, an impulse of which the level would present, from the beginning to the end, a slight decrease.

FIG. 6 represents application time diagrams of the control impulses C1 and C2 respectively to the thyristors 26 and 45. Discharge impulse C2 of the delay lines is applied periodically with a period T. In the example described, T is equal to 20 milliseconds and corresponds to a recurrence frequency of 50 Hertz. The control impulse C1, applied according to a same period as the impulse C2, is delayed by a duration t with respect to it in order of allow efficient deionization of the thyristor 45 at the end of discharging. It only authorizes the recharge of the delay line when the thyristors 45 are again blocked. This duration t is experimentally adjusted, in one example it is equal to 2 milliseconds.

In the application described, the impulse introduced at the primaries of the transformer has an amplitude of 500 volts; the total of the currents that passed through the various primary windings is equal to 13.000 amperes; the duration of this impulse is about 300 microseconds. Under these conditions the impulse available at the secondary 57 has an amplitude of 40 kilovolts and the current available equals 150 amperes. These values are the same as those normally used to supply in voltage a high frequency triode tube electromagnetically exciting the cavities of a linear accelerator. It should be noted that this application is not the only one to be envisaged, particularly in the field of radars. The excitation of magnetrons or klystrons can also be realized with such a modulator.

We claim:

1. Power modulator equipped with a transformer to receive electrical impulses produced by an impulse generator stage and to produce higher voltage electric impulses, wherein the said transformer is one of the armoured type and comprises a certain number of primary windings connected in parallel to said impulse generator stage through distribution elements, these primary windings being wound about the secondary winding of this transformer, said primary windings each being connected to said distribution elements by a pair of conductor wires connected to opposite ends of the primary windings which are brought close together to reduce inductive losses.

2. Power modulator according to claim 1, wherein said impulse generator stage comprises at least one delay line connected to an impulse switch.

3. Power modulator according to claim 1, wherein the transformation ratio is higher than 40.

4. Power modulator according to any one of claims 1 to 3, wherein each primary winding is realized in a generally spiral form along a segment and all said segment are joined in order to spread over the length of the secondary winding.

5. Power modulator according to any one of claims 1 to 3, wherein said primary windings are realized in a single cylindrical sheath common to all these windings, said sheathsurrounding said secondary winding.

6. Power modulator according to claim 1, wherein said primary windings are grouped into m groups, each of said two connection conductor wires of each of said primary windings of a group being connected, on the one hand to a hot element, common to all said groups and on the other hand, to a cold element particular to this group.

7. Power modulator according to claim 6, wherein the number of primary windings is equal to 40 and the number m of groups equal to 4.

8. Power modulator according to claim 6, wherein it comprises m delay lines connected to m impulse switches and each impulse switch is connected in parallel, on the other hand, in the common hot element and, on the other hand, on the cold element of a group.

9. Power modulator according to claim 2, wherein said delay lines comprises a succession of half-cells formed of capacitors and inductances, said inductances having the same number of turns, the diameter d of which increases from one end to the other of the line depending on the approach to the transformer.

10. Power modulator to claim 2, wherein said delay lines comprise a succession of half-cells, formed of capacitors and inductances aligned along a direction D and the said inductances are formed of turns of which the winding axes, approximately parallel, are inclined with respect to the direction of said delay line by an angle of about 60°.

11. Power modulator according to claim 2, wherein the output terminals of each delay line are connected to said impulse switches by output conductors, close to each other.

* * * * *